US006669811B2

(12) United States Patent
Hao et al.

(10) Patent No.: US 6,669,811 B2
(45) Date of Patent: *Dec. 30, 2003

(54) LINEAR DRIVE SYSTEM FOR USE IN A PLASMA PROCESSING SYSTEM

(75) Inventors: Fangli Hao, Cupertino, CA (US); Keith Dawson, Livermore, CA (US); Eric H. Lenz, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 10/012,265

(22) Filed: Nov. 5, 2001

(65) Prior Publication Data

US 2002/0100555 A1 Aug. 1, 2002

Related U.S. Application Data

(63) Continuation of application No. 09/474,843, filed on Dec. 30, 1999, now Pat. No. 6,350,317.

(51) Int. Cl.[7] .................... H01L 21/306; C23F 1/00; B05C 13/00; C23C 16/00; C23C 14/00
(52) U.S. Cl. ............................. 156/345.3; 156/345.1; 118/723 R; 118/727; 118/71; 204/298.23
(58) Field of Search .................. 204/298.12, 298.23, 204/298.29; 118/723 R, 727, 71; 156/345.1, 345.3

(56) References Cited

U.S. PATENT DOCUMENTS

| 4,379,743 A | 4/1983 | Nakatsukasa et al. ....... 204/298 |
| 4,478,701 A | 10/1984 | Welch et al. ................ 204/298 |
| 4,797,054 A | 1/1989 | Arii ............................ 414/217 |
| 4,851,095 A | 7/1989 | Scobey et al. ......... 204/192.12 |
| 4,944,860 A | 7/1990 | Bramhall, Jr. et al. .. 204/298.23 |
| 5,110,437 A | 5/1992 | Yamada et al. ........ 204/298.33 |
| 5,178,739 A | 1/1993 | Barnes et al. .......... 204/192.12 |
| 5,284,561 A | 2/1994 | Shinnerman et al. .. 204/192.13 |
| 5,354,413 A | 10/1994 | Smesney et al. ......... 156/362.7 |
| 5,534,751 A | 7/1996 | Lenz et al. ............. 315/111.71 |
| 5,552,124 A | 9/1996 | Su ............................... 156/345 |
| 5,651,867 A | 7/1997 | Kokaku et al. ........ 204/298.25 |
| 5,672,882 A | 9/1997 | Day et al. .............. 250/492.21 |
| 5,730,847 A | 3/1998 | Hanaguri et al. ...... 204/298.41 |
| 5,889,248 A | 3/1999 | Plettner et al. ................. 218/7 |
| 5,961,798 A | 10/1999 | Robinson et al. ...... 204/298.25 |
| 6,019,060 A | 2/2000 | Lenz ..................... 118/723 R |
| 6,350,317 B1 * | 2/2002 | Hao et al. ..................... 118/71 |

FOREIGN PATENT DOCUMENTS

WO        99/67807      12/1999   ............ H01J/37/32

* cited by examiner

*Primary Examiner*—Steven H. VerSteeg
(74) *Attorney, Agent, or Firm*—Beyer Weaver & Thomas, LLP

(57) ABSTRACT

A plasma processing system for processing a substrate is disclosed. The system includes a process component capable of effecting a plasma inside a process chamber. The system also includes a gear drive assembly for moving the process component in a linear direction during processing of the substrate.

24 Claims, 7 Drawing Sheets

LINEAR DRIVE SYSTEM FOR USE IN A PLASMA PROCESSING SYSTEM

CROSS REFERENCE TO RELATED APPLICATION

This application is a continuation of U.S. patent application Ser. No.: 09/474,843, which was filed on Dec. 30, 1999, now U.S. Pat. No. 6,350,317, issued Feb. 26, 2002 and which is herein incorporated by reference.

BACKGROUND OF THE INVENTION

The present invention relates to apparatuses and methods for processing substrates such as semiconductor substrates for use in IC fabrication or panels (e.g., glass, plastic, or the like) for use in flat panel display applications. More particularly, the present invention relates to improved methods and apparatuses for moving components associated with processing a substrate.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and display panels. In a typical plasma processing application, the processing source gases (such as the etchant gases or the deposition source gases) are introduced into a process chamber. Energy is then provided to ignite a plasma in the processing source gases. After the plasma is ignited, it is sustained with additional energy, which may be coupled to the plasma in various well-known ways, e.g., capacitively, inductively, through microwave, and the like. The plasma is then employed in a processing task, e.g., to selectively etch or deposit a film on the substrate.

During deposition, materials are deposited onto a substrate surface (such as the surface of a glass panel or a wafer). For example, deposited layers such as various forms of silicon, silicon dioxide, silicon nitride, metals and the like may be formed on the surface of the substrate. Conversely, etching may be employed to selectively remove materials from predefined areas on the substrate surface. For example, etched features such as vias, contacts, or trenches may be formed in the layers of the substrate.

In processing the substrates, one of the most important parameters that engineers strive to improve is process uniformity. As the term is employed herein, process uniformity refers to the uniformity across the surface of a substrate, the uniformity between different substrates processed in the same process chamber, and the uniformity between different substrates processed in different process chambers. If the process is highly uniform, for example, it is expected that the process rates at different points on the substrate, as well as process rates between different substrates in a production run, tend to be substantially equal. In either case, it is less likely that one area of the substrate will be unduly over-processed while other areas remain inadequately processed or that one substrate will be processed differently than another substrate. As can be appreciated, process uniformity is an important determinant of yield and therefore a high level of process uniformity tends to translate into lower costs for the manufacturer.

In many applications, process uniformity is difficult to maintain because of variations found in various parameters associated with processing a substrate. By way of example, the wafer area pressure (WAP), i.e., pressures surrounding the surface of the substrate, may fluctuate during a run of substrates because of temperature changes proximate the substrate. As is well known to those skilled in the art, if the WAP is higher for one substrate and lower for another substrate the desired processing performance between the substrates tends to be non-uniform. Additionally, if the WAP is higher across one area of the substrate and lower across another area of the substrate the desired processing performance across the surface of the substrate tends to be non-uniform.

One technique for controlling the WAP has been to provide a confinement ring inside the process chamber. The confinement ring is generally configured to surround the substrate in the active region, which is typically above the substrate to be processed. In this manner, the processing performed is more confined and therefore the WAP is more uniform. Although this technique works well for a number of applications, in many applications it would be desirable to provide a more controlled processing environment that can adaptively change to accommodate variations in the WAP during processing of a single substrate, during processing of a plurality of substrates in a production run or during processing in different chambers.

Recently, there have been some efforts to provide a moving confinement ring that can adjust the exhaust conductance and therefore the WAP. In this manner, the WAP can be controlled to reduce variations that might occur during processing. One particular approach uses a cam system to move the confinement ring up and down between upper and lower electrodes. In this approach, a circular cam with varying levels on its surface is perpendicularly engaged with a plunger/spring mechanism that is connected to the confinement ring. As the cam turns, the plunger is moved up or down according to the different levels on the surface of the cam, and as a result the confinement ring correspondingly moves up or down. Accordingly, the cam mechanism can be configured to control the gap between the confinement ring and lower electrodes so as to adjust the exhaust conductance and therefore the WAP in the active region above the substrate.

Although this technique generally works well, one problem is that the conventional cam approach provides only a limited range of pressure control, low sensitivity and low resolution (i.e., low precision). By way of example, the slope or level of the surface of the cam is limited by the plunger/cam interface because the plunger may get stuck if the slope is too large. As a result, the overall distance the plunger moves is restricted, which leads to the limited range of pressure control. Further, precise changes in the pressure during processing cannot be performed with the conventional cam approach. Further still, the plunger/cam interface may wear and the spring may loose springiness, both of which tend to reduce the reliability of the system.

Among the important issues to manufacturers is the cost of ownership of the processing tool, which includes, for example, the cost of acquiring and maintaining the system, the frequency of chamber cleaning required to maintain an acceptable level of processing performance, the longevity of the system components, and the like. Thus a desirable process is often one that strikes the right balance between the different cost-of-ownership and process parameters in such a way that results in a higher quality process at a lower cost. Further, as the features on the substrate become smaller and the process becomes more demanding (e.g., smaller critical dimensions, higher aspect ratios, faster throughput, and the like), engineers are constantly searching for new methods and apparatuses to achieve higher quality processing results at lower costs.

In view of the foregoing, there is a need for improved methods and apparatuses for moving components (i.e., a confinement ring) associated with processing a substrate.

SUMMARY OF THE INVENTION

The invention relates, in one embodiment, to a plasma processing system for processing a substrate. The system includes a process component capable of effecting the plasma within the process chamber. The system further includes a gear drive assembly for moving the process component in a linear direction during processing of the substrate.

The invention relates, in another embodiment, to a plasma processing system for processing a substrate. The system includes a confinement ring for confining a plasma inside a process chamber. The system also includes a gear drive assembly for moving the confinement ring in a linear direction during the processing of the substrate.

The invention relates, in another embodiment, to a plasma processing system for processing a substrate. The system includes an electrode for generating an electric field inside a process chamber. The system also includes a gear drive assembly for moving the electrode in a linear direction during the processing of the substrate.

The invention relates, in another embodiment, to a plasma processing system for processing a substrate. The system includes an electrode for generating an electric field inside a process chamber. The system also includes a confinement ring for confining a plasma inside the process chamber. The system further includes a gear drive assembly for moving the confinement ring or the electrode.

DESCRIPTION OF THE DRAWINGS

The present invention is illustrated by way of example, and not by way of limitation, in the figures of the accompanying drawings and in which like reference numerals refer to similar elements and in which.

DESCRIPTION OF THE INVENTION

Figure 1:
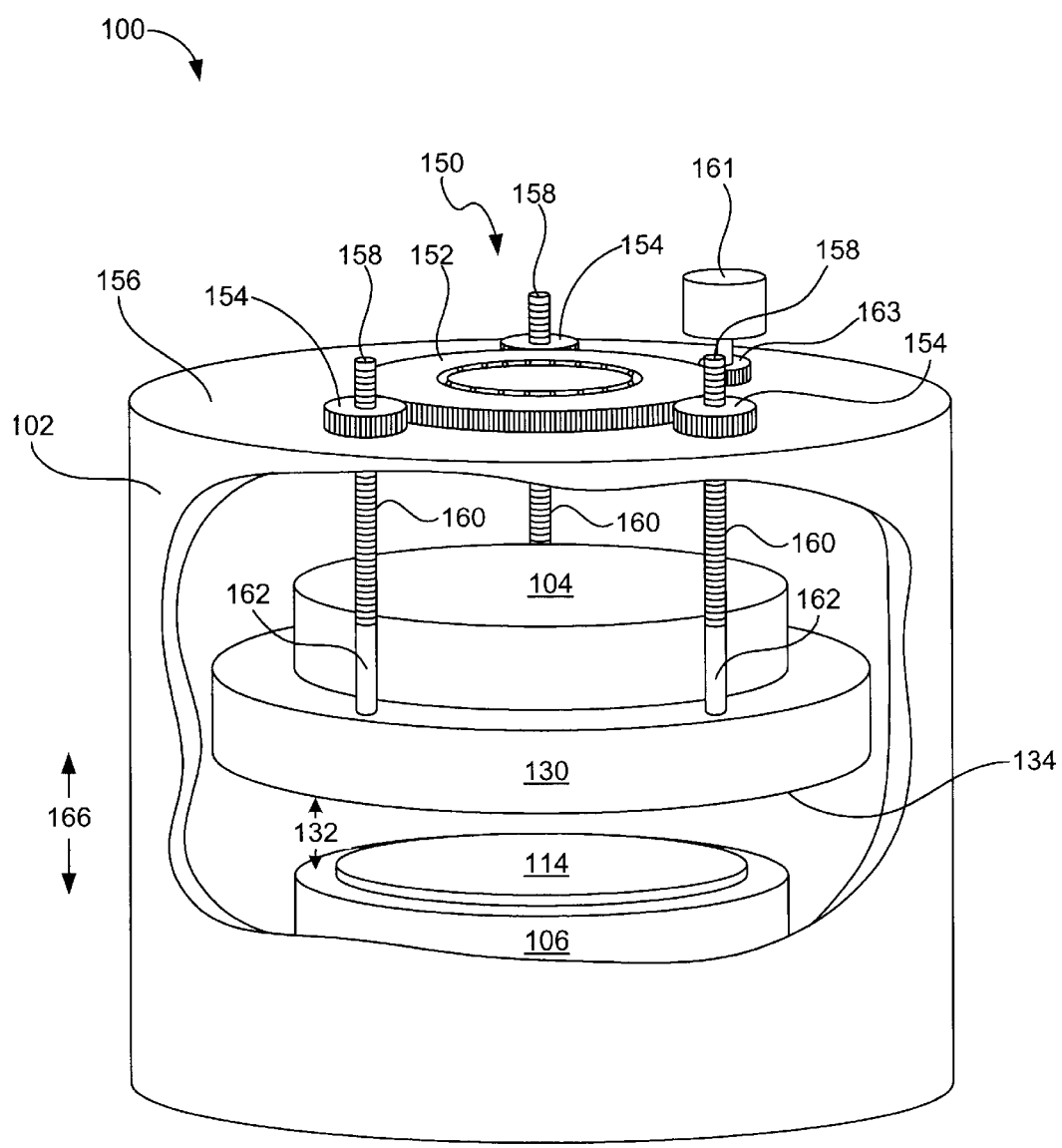
FIG. 1 is a broken away, perspective view of a plasma reactor, in accordance with one embodiment of the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

The present invention provides a linear drive assembly that is capable of moving a body associated with processing a substrate with a high degree of movement control. The linear drive assembly includes a plurality of gears that are operatively engaged with one another. The linear drive assembly also includes a plurality of positioning members that are movably coupled to a predetermined set of the gears and structurally coupled to a movable body. The positioning members are configured to move the body in a linear direction when the predetermined set of gears are rotated. In one specific application, the positioning members are shafts having external threads that are configured to mate with internal threads of the predetermined set of gears. Correspondingly, when the predetermined set of gears are rotated, the rotation of the gears rotate the internal thread, which in turn causes the shaft to move in the linear direction. Accordingly, the use of gears and threads provide a high degree of control of linear movements of the body. For example, the gear/thread arrangement allows for more precise movements with increased resolution, sensitivity and reliability.

The invention relates, in one embodiment, to a plasma processing system that is capable of a high degree of processing uniformity control. The plasma processing system is configured for processing a substrate and includes a process chamber, a lower electrode, an upper electrode and a confinement ring that are employed to both generate the plasma and to contain the plasma for the processing task.

In accordance with one aspect of the present invention, the linear motion of the linear drive assembly is configured to control the gap between the confinement ring and the lower electrode during processing. In particular, the linear drive assembly is arranged to move the confinement ring up and down, between the upper electrode and the lower electrode, to adjust the exhaust conductance. By adjusting the exhaust conductance, the pressure (i.e., WAP) inside the active region above the substrate may be maintained at a desired level for processing. Accordingly, the pressure can be controlled with little variation during processing to provide increased process uniformity, which increases substrate throughput, reduces device failure, and increases the overall productivity of the substrates being processed.

In accordance with another aspect of the present invention, the linear motion of the linear drive assembly is configured to control the gap between the upper electrode and the substrate during processing. In particular, the linear drive assembly is arranged to move the upper electrode up and down to adjust the volume of the active region above the substrate. By adjusting the volume, various parameters associated with plasma processing, such as the plasma density and pressure, may be maintained at desired levels for processing. Similarly, the plasma density and pressure can be controlled with little variation during processing to provide increased process uniformity, which increases substrate throughput, reduces device failure, and increases the overall productivity of the substrates being processed.

In accordance with another aspect of the present invention, the linear motion of the linear drive assembly is configured to independently control the gap between the confinement ring and the lower electrode and the gap between the upper electrode and the substrate during processing. In this particular embodiment, the linear drive assembly is reconfigured to include additional gears. For example, the linear drive assembly also includes a second set of predetermined gears and positioning members. In this manner, the first set of predetermined gears and positioning members are configured to move the confinement ring and the second set of predetermined gears and positioning members are configured to move the upper electrode. A transfer gear is also included to operatively engage or disengage the predetermined gears from the first gear. Accordingly, because both gaps are controlled, the process engineer has increased control over the processing conditions surrounding the substrate to be processed.

In a preferred embodiment, the present invention is practiced in a plasma reactor, such as the capacitively coupled plasma reactor, which is available from Lam Research Corporation of Fremont, Calif. Although a capacitively coupled plasma reactor will be shown and described, it should be noted that the present invention may be practiced in any plasma reactor that is suitable for forming a plasma, such as an inductively coupled or an ECR reactor.

Figure 2:
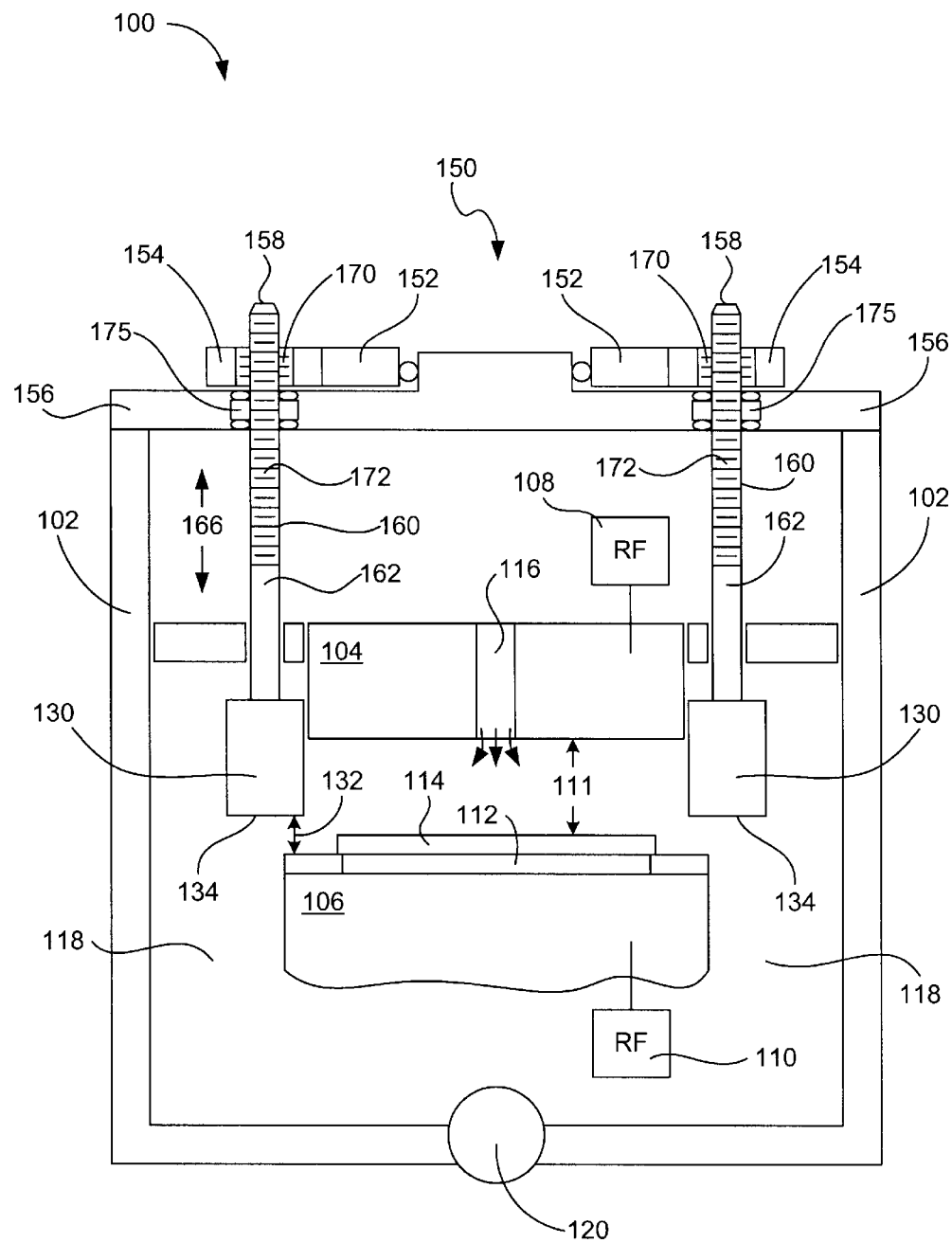
FIG. 2 is a side elevation view, in cross section, of the plasma reactor of FIG. 1.

FIGS. 1 and 2 illustrate a simplified schematic of plasma reactor 100, according to one embodiment of the invention. The plasma reactor 100 generally includes a plasma processing chamber 102. Inside chamber 102, there is disposed an upper electrode 104 and a lower electrode 106. Upper electrode 104 is disposed above lower electrode 106 and is coupled to a first RF power supply 108 via a matching network (not shown to simplify the illustration). First RF power supply 108 is configured to supply upper electrode 104 with RF energy. Additionally, lower electrode 106 is coupled to a second RF power supply 110, which is configured to supply lower electrode 106 with RF energy.

Furthermore, the gap 111 between the upper and lower electrode 104, 106 generally determines the volume of an active region during processing. Therefore, the size of gap 111 can be configured to control various parameters such as the pressure and/or plasma density. While not wishing to be bound by theory, it is believed that a smaller volume may increase plasma density and a larger volume may decrease plasma density. As is well known to those skilled in the art, the plasma density tends to effect the rate of processing, for example, the etch rate. Correspondingly, the gap may be configured to balance the desired volume and thus the desired etch rate for processing.

Further still, it is generally believed that the gap 111 plays an important role in controlling the pressure inside the active region above the substrate. As a general rule, the pressure is inversely proportional to the volume, where a decrease in the volume corresponds to an increase in pressure, and an increase in the volume corresponds to a decrease in pressure. Accordingly, the size of the gap 111 is preferably configured to balance the desired volume with the desired pressures for processing.

Plasma reactor 100 also includes a chuck 112, which is disposed on the top surface of the lower electrode 106. The chuck 112 is configured to hold a substrate 114 during processing. Chuck 112 may represent, for example, an ESC (electrostatic) chuck, which secures substrate 114 to the chuck's surface by electrostatic force. Additionally, substrate 114 represents the work-piece to be processed, which may represent, for example, a semiconductor substrate to be etched, deposited, or otherwise processed or a glass panel to be processed into a flat panel display.

Further, a gas port 116 for releasing gaseous source materials, e.g., the etchant source gases, into the active area between the upper electrode and the substrate is typically provided within process chamber 102. As illustrated in FIG. 2, gas port 116 is disposed inside the upper electrode 104. Additionally, an exhaust port 118 for exhausting by-product gases formed during processing is generally disposed between the chamber walls of the process chamber and the lower electrode 106. In FIG. 2, exhaust port 118 is coupled to a pump 120 located at the bottom of chamber 102. The pump 120 is generally arranged to maintain the appropriate pressure inside chamber 102. In one implementation, a turbomolecular pump is used.

By way of example, in order to create a plasma, a process gas is input into chamber through the gas port 116. Power is then supplied to the electrodes 104 and 106 and a large electric field is produced between the upper and lower electrodes 104 and 106. As is well known in the art, the neutral gas molecules of the process gas when subjected to these strong electric fields lose electrons, and leave behind positively charged ions. As a result, positively charged ions, negatively charged electrons and neutral gas molecules are contained inside the plasma. In addition, a sheath voltage is typically generated directly above the substrate, which causes the ions to accelerate towards the substrate where they, in combination with neutral species, activate the processing reaction.

Figure 4:
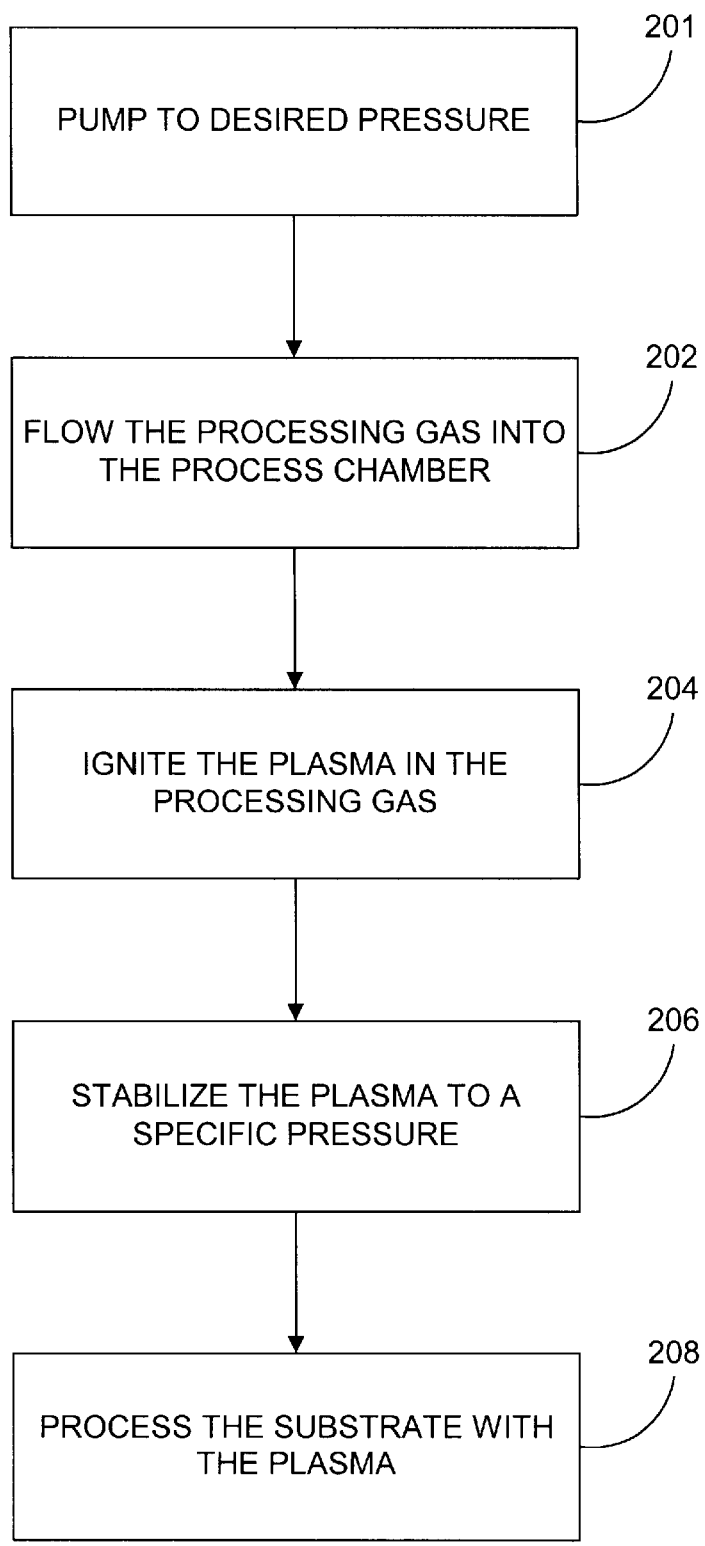
FIG. 4 is a flow diagram depicting the relevant steps involved in processing a substrate in the plasma reactor of FIGS. 1–3, in accordance with one embodiment of the present invention.

To further illustrate the process, FIG. 4 shows a flow diagram of the relevant operations involved in processing a substrate in a plasma reactor (e.g., plasma reactor 100). Prior to processing, conventional pre-processing operations, which may involve the egress and ingress of substrates, are performed. The exemplary process typically takes five steps. The first step 201 involves pumping the process chamber to the desired pressure. The second step 202 involves flowing a processing gas into the process chamber and allowing the pressure to stabilize. Once the gas is stable, the third step 204 ignites the plasma in the processing gas. After the plasma is ignited, the fourth step 206 stabilizes the plasma to a specific pressure inside the chamber. After the chamber pressure has been stabilized, the fifth step 208 processes the substrate.

Referring back to FIGS. 1 and 2, plasma processing reactor 100 further includes a confinement ring 130, which is generally configured to confine a plasma to the area above the substrate 114. As shown in FIG. 2, a first portion of the confinement ring 130 is positioned around the outer periphery of the upper electrode 104 and a second portion is positioned to surround the gap 111 between the upper electrode 104 and the lower electrode 106 to enclose at least a portion of the active region above the substrate 114. The confinement ring 130 is also symmetrically disposed around the periphery of the substrate 114 to produce more uniform processing.

As illustrated, a gap 132 is typically formed between a bottom edge 134 of the confinement ring 130 and the lower electrode 106. The gap 132 is generally provided to control the conductance of exhaust gases while substantially confining a plasma to the volume defined by the upper electrode 104 and the confinement ring 130. Preferably, the bottom edge of the confinement ring 130 is evenly spaced from the top surface of the lower electrode 106 (e.g., parallel) so that an even distribution of gases at the surface of the substrate 114 may be maintained.

The size of gap 132 generally determines the rate at which exhaust gases are removed from the active region during processing. While not wishing to be bound by theory, it is believed that too small a gap may impede the flow of gases which may lead to non-uniform etch rates and particle contamination along the periphery of the substrate. Further, it is believed that too large a gap may not properly confine the plasma to an appropriate volume, which may also lead to non-uniform etch rates (e.g., a non-uniform plasma). Further still, it is generally believed that the gap plays an important role in controlling the pressure inside the active region above the substrate. That is, the pressure is inversely proportional to the exhaust rate, where a decrease in the conductance corresponds to an increase in pressure, and an increase in the conductance corresponds to a decrease in pressure. Accordingly, the size of the gap is preferably configured to balance the desired conductance with the desired pressures.

FIGS. 1 and 2 also illustrate a linear drive assembly 150 configured for moving the confinement ring 130 between the upper electrode 104 and lower electrode 106, in accordance with one embodiment of the present invention. By moving the confinement ring 130 up and down during processing, the conductance of the etchant source gas out of the plasma process chamber 102 may be increased or decreased to keep the pressure in the pressure ranges desired for processing. By way of example, the pressure may be adjusted to accommodate temperature fluctuations that occur during a run of substrates thereby maintaining substrate to substrate uniformity. Furthermore, the linear drive assembly 150 can be configured to move the confinement ring up and down for the ingress and egress of substrate 114.

The linear drive assembly 150 generally includes a first gear 152 and a plurality of second gears 154. Both first gear 152 and the plurality of second gears 154 are rotatably supported by a cover 156 of process chamber 102. Furthermore, the plurality of second gears 154 are operatively engaged with first gear 152. Linear drive assembly 150 also includes a plurality of positioning members 158 each having a first portion 160 and a second portion 162. Each of the positioning members 158 are parallel to one another. Each of the first portions 160 are movably coupled to one of the second gears 154 to allow movement of the positioning members 158 in a linear direction 166. Each of the second portions 162 are fixed to the confinement ring 130. As shown in FIG. 1, the linear direction 166 is perpendicular to the plane created by the top surface of substrate 114. Additionally, seals 175 are generally provided between the positioning members 158 and the cover 156 to seal the interface to eliminate leaks.

Moreover, the linear drive assembly includes a motor 161 and a driving gear 163, which is fixed to motor 161. Motors are well known to those skilled in the art, and therefore will not be discussed herein for brevity's sake. The driving gear 163 is operatively engaged with the first gear 152, and configured for driving the first gear 152 when the motor is actuated. Essentially, motor 161 drives driving gear 163, driving gear 163 drives first gear 152, first gear 152 drives the plurality of second gears 154, and the plurality of second gears 154 move the corresponding positioning members 158 in linear direction 166, which as a result moves the confinement ring 130 in linear direction 166 between upper electrode 104 and lower electrode 106.

The direction that the positioning members 158 move along the linear path is generally determined by the direction of rotation of the second gears 154. By way of example, the linear drive assembly 150 may be configured to move the positioning member 158 up when the second gears 154 are rotated clockwise and down when the second gears 154 are rotated counter clockwise.

Referring to FIG. 2, the plurality of positioning members 158 are threadably coupled to the plurality of second gears 154. That is, the positioning members 158 and the second gears 154 are fitted with screw threads, which move the positioning members 158 in the linear direction when the second gears 154 are rotated. The second gears 154 generally include a nut portion 170 having an internally threaded surface, and the positioning members 158 generally include a thread portion 172 having an externally threaded surface. The externally threaded surface of each of the positioning members 158 is configured to mate with the internally threaded surface of a corresponding second gear 154. Correspondingly, when the second gears 154 are rotated, the threaded portion 172 of the positioning members 158 travel through the nut portion 170 of the rotating second gears 154. One particular advantage of the threads are that they are constantly engaged and thus permit very precise movements to be made.

Further, the positioning member/second gear arrangement is generally arranged so that when the nut portion 170 has made one revolution, the positioning member 158 has moved one full thread. As is well known to those skilled in the art, the distance between corresponding points on adjacent threads measured along the length of the screw is generally referred to as the pitch. Thus, when the nut portion 170 makes one revolution, the positioning member 158 is moved the distance of the pitch. By way of example, if the screw threads are cut at 32 threads per inch, then one turn of the second gear (e.g., nut portion 170) moves the positioning member 158 $\frac{1}{32}$ of an inch. As can be appreciated, the cut of the threads may be arranged to provide increased resolution. That is, a greater number of threads per inch tends to allow smaller incremental movements of the positioning member 158, which in turn allows finer adjustments in pressure. By way of example, a thread having between about 10 to about 40 threads per inch works well. However, it should be noted that this is not a limitation and that the amount of threads per inch may vary according to the specific design of each process chamber.

Figure 3:
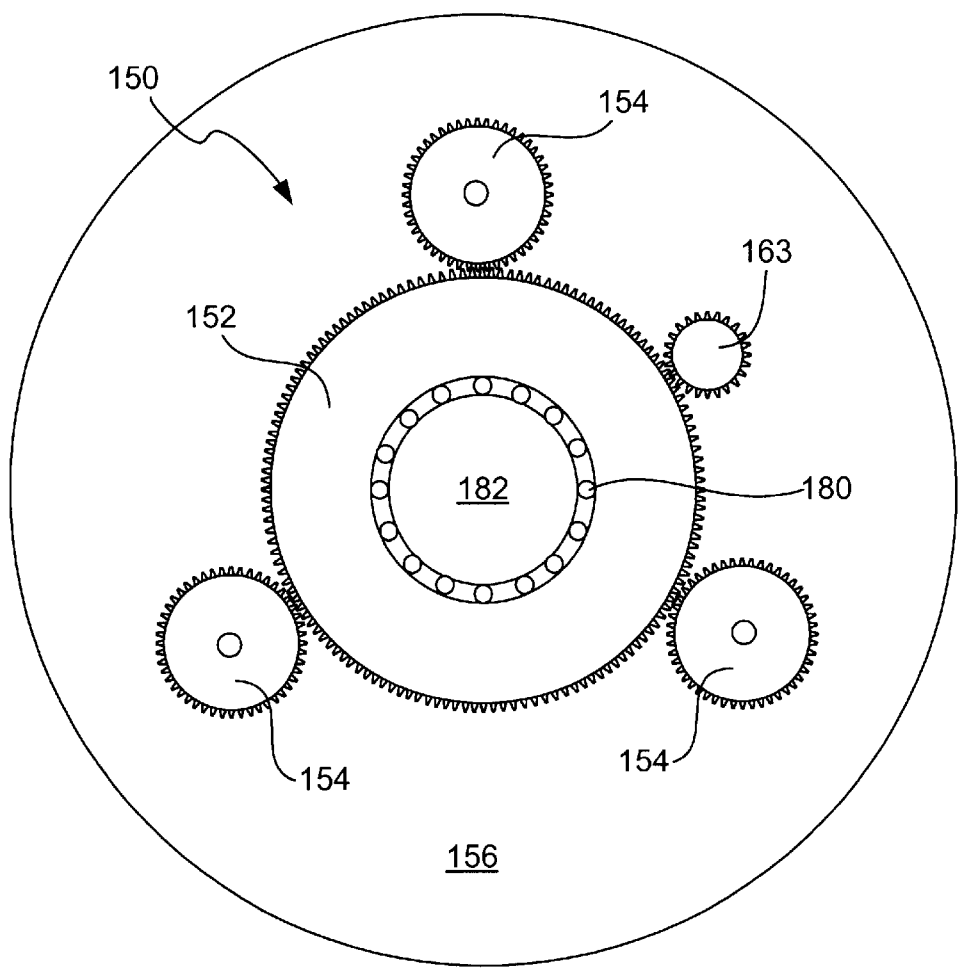
FIG. 3 is a top elevation view, in cross section, of the plasma reactor of FIG. 1.

To further discuss the features of the present invention, FIG. 3 illustrates a top view of linear drive assembly 150 of plasma reactor 100. As mentioned, the linear drive assembly 150 includes first gear 152, the plurality of second gears 154, the positioning members 158 and the driving gear 164. The plurality of second gears 154 and the driving gear 164 are generally disposed about the periphery of the first gear 152. For the most part, the movement of the second gears 154 are synchronized with one another. That is, the direction of movement (e.g., clockwise or counter clockwise) and the magnitude of the movement (e.g., amount of teeth that are moved) are the same.

While the linear drive assembly 150 is shown and described as using external spur gears, it will be appreciated that other gear configurations may also be used to accommodate different process chambers or to conform to other external factors necessary to allow linear movements. For example, internal gears (e.g., planetary gears) may also work well. If internal gears are used, the plurality of second gears and the driving gear would be disposed about the inner periphery of the first gear.

As shown in FIG. 3, the linear drive assembly 150 includes three second gears 154 and three positioning members 158. As is well known to those skilled in the art, three points define a plane and therefore it is preferable to have three positioning members moving the confinement ring. The three positioning members 158 are configured to move the confinement ring 130 orthogonal to its center of gravity thereby keeping the confinement ring 130 balanced and level. As shown, each of the second gear/positioning member arrangements are symmetrically spaced around the first gear 152, and each of the positioning members 158 are axially oriented in the center the corresponding second gear 154. It should be noted that the present invention is not limited to three positioning members and any number of positioning members may be used that are suitable for moving the confinement ring, while keeping it balanced.

As is well known to those skilled in the art, in order for all of the gears to mesh properly, i.e., turn without slippage, the gears have to be configured with similar teeth that are about the same size. Furthermore, a small gap between gears is typically provided for smoother and quieter movements between meshed gears. One particular advantage of the gear assembly is that the gears are constantly meshed together and therefore there is generally no creep or slip, and thus very precise movements may be made.

One important factor in determining the sensitivity and resolution of the linear drive assembly is in the selection of the appropriate gear dimensions (e.g., teeth). It is generally believed that the greater the amount of teeth the greater the resolution. That is, the greater the amount of teeth, the smaller the incremental changes in distance moved by the positioning member and thus smaller changes in pressure. In essence, every gear has x number of teeth resolution. To elaborate further, the amount of teeth can be described as individual segments of the gear. By way of example, if the second gear has 10 teeth then the second gear can be broken up into 10 segments. These segments correspond to incremental movements of the second gear. If only one tooth is moved, then the second gear moves only one segment, and thus the second gear makes only $\frac{1}{10}$ of a rotation. Because of the engagement between the second gear and the positioning member, the positioning member correspondingly moves only $\frac{1}{10}$ of the pitch. If the pitch is $\frac{1}{32}$ of an inch, then the positioning member will move $\frac{1}{320}$ of an inch. By way of example, a second gear having between about 10 to about 48 teeth work well. However, it should be noted that this is not a limitation and that the amount of teeth on the second gear may vary according to the specific design of each process chamber.

The gears may be formed from any suitable material such as metals and plastics, and may be manufactured using any known process such as casting, forging, extrusion, injection molding, and the like. However, if the gears or the cover of the process chamber encounter thermal expansion (e.g., if the temperature is high) it may be necessary to form them out of materials with substantially the same thermal expansion coefficient so that they will expand at about the same rate. This is generally not a factor if the thermal expansion is small because the gap between gears is typically larger than the amount of thermal expansion. Further, a lubricant or oil may also be used between gears to reduce the effects of thermal expansion, as well as, to reduce wear between mating gears.

As mentioned, the gears are rotatably supported by the process chamber cover. In one embodiment, bearing gears that allow the gears to rotate freely are used. As shown in FIG. 3, the first gear 152 is configured as a concentric ring having an inner periphery that is in cooperation with a set of bearings 180. More particularly, the set of bearings 180 are disposed between the inner periphery of the first gear 152 and a portion 182 of the cover 156. Accordingly, the portion 182 of the cover 156 may be used as a passage way for gas ports, sensors, manometers, etc. Bearing gears are well known and for the sake of brevity will not be discussed in any more detail. Furthermore, the second gears are rigidly fixed to the cover of the process chamber. In one implementation, thrust bearings are used to fix the second gears to the cover of the process chamber.

A linear drive assembly (e.g., 150) is generally part of a closed loop control system that is configured to reduce pressure fluctuations inside a process chamber. By way of example, a plasma processing apparatus may be configured to include a pressure sensor for measuring pressures inside the active region above a substrate, and a controller or central CPU for monitoring the measured pressures. Both a motor of the linear drive assembly and the pressure sensor are operatively coupled to the controller. The pressure sensor is configured to produce an electrical pressure signal corresponding to the measured pressure. The controller is configured to receive the electrical pressure signal from the pressure sensor and to send a corresponding electrical control signal, which is based at least in part on the received signal, to the motor. Furthermore, the motor is configured to receive and implement the electrical control signal sent by the controller. The electrical control signal generally relates to a specific direction and an incremental change in position for the motor. Pressure sensors, controllers and motors are well known in the art, and therefore will not be described in detail.

In accordance with another embodiment of the present invention, the linear motion of a linear drive assembly is configured to control the gap between the upper electrode and the substrate. In this particular embodiment, the positioning members are fixed to the upper electrode, rather than the confinement ring. Correspondingly, the linear drive assembly is arranged to move the upper electrode up and down to adjust the volume of the active region above the substrate. By adjusting the volume, various parameters associated with plasma processing, such as the plasma density and pressure, may be maintained at desired levels for processing.

Figure 5:
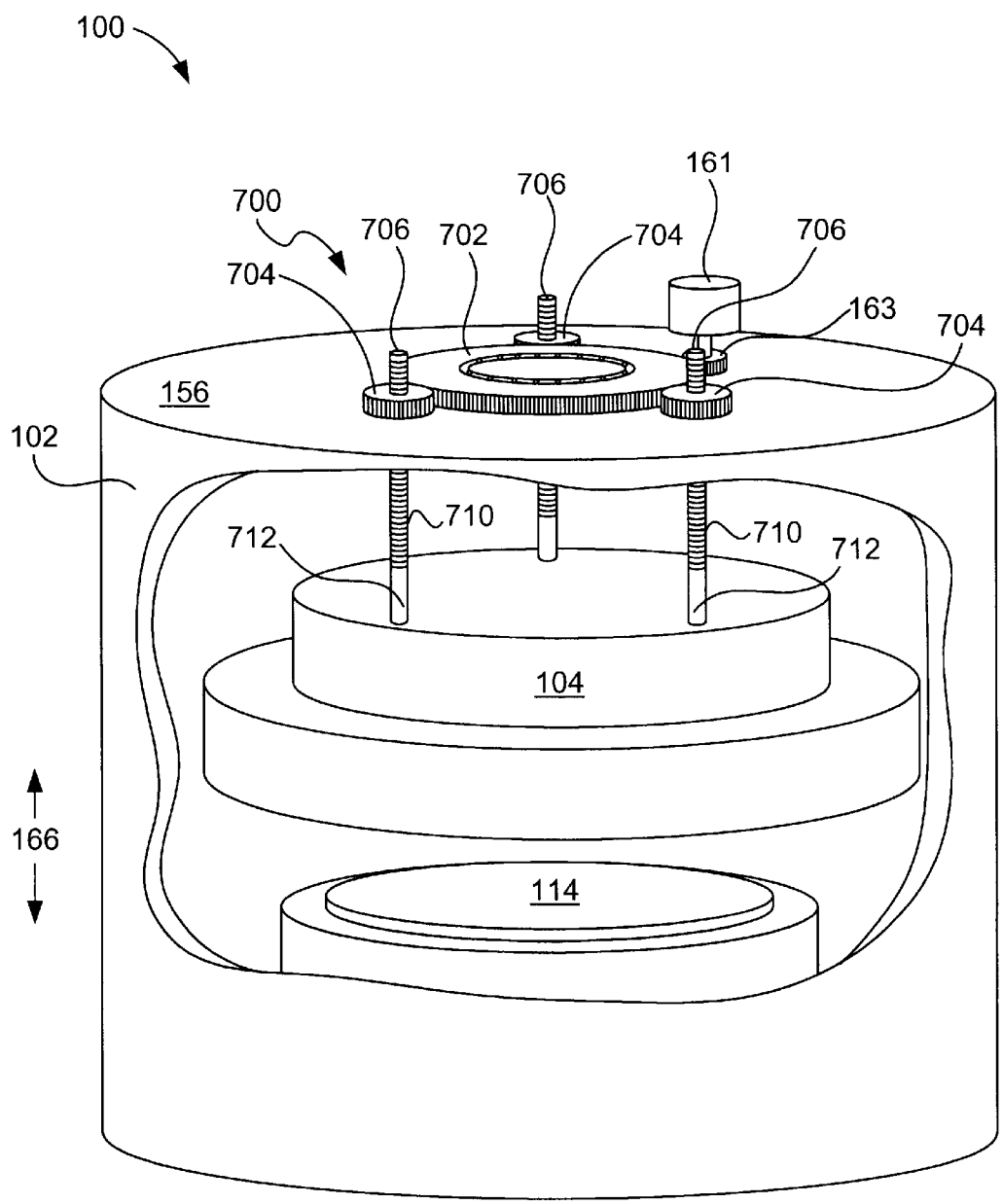
FIG. 5 is a broken away, perspective view of a plasma reactor, in accordance with one embodiment of the present invention.

To facilitate discussion of this aspect of the present invention, FIG. 5 shows plasma reactor 100 including a linear drive assembly 700 that is configured for moving the upper electrode 104 inside the process chamber 102. In this figure, the linear drive assembly 700 is produced in accordance with the teachings of the invention set fourth above with regards to FIGS. 1–4 and therefore will only be described in brief.

The linear drive assembly 700 generally includes a first gear 702 and a plurality of second gears 704. Both first gear 702 and the plurality of second gears 704 are rotatably supported by the cover 156 of process chamber 102. Furthermore, the plurality of second gears 704 are operatively engaged with first gear 702. Linear drive assembly 700 also includes a plurality of positioning members 706 having a first portion 710 and a second portion 712. The first portion 710 is movably coupled to the second gear 704 in a linear direction 166, and the second portion 712 is fixed to the upper electrode 104. As shown, the linear direction 166 is perpendicular to the plane created by the top surface of substrate 114. Furthermore, the positioning members 706 are threadably coupled to second gears 704. As mentioned previously, the positioning members 706 and the second gears 704 are fitted with screw threads which move the positioning members 706 in the linear direction 166 when the first gear 702 is rotated.

Moreover, the linear drive assembly 700 includes a motor 161 and a driving gear 163, which is fixed to motor 161. The driving gear 163 is operatively engaged with the first gear 702, and configured for driving the first gear 702 when the motor 161 is actuated. Essentially, motor 161 drives driving gear 163, driving gear 163 drives first gear 702, first gear 702 drives the plurality of second gears 704, and the plurality of second gears 704 move the corresponding positioning members 706 in linear direction 166, which as a result moves the upper electrode 104 in the linear direction 166.

Although the linear drive assembly has been shown and described as moving a confinement ring or an upper electrode, it will be appreciated that other components may also be moved to accommodate different processes. For example, the linear drive assembly may be used to move the lower electrode. Furthermore, it should be noted that the present invention is not limited to moving components inside the process chamber. For example, the linear drive assembly may be used to move an antenna or an electrode that is disposed outside the chamber. If this type of system is used, the linear drive assembly is generally coupled to a frame of the plasma reactor, rather than to the cover of the process chamber as shown. Additionally, it should be understood that the linear drive assembly is not limited to moving one component and may be used to move a plurality of components. For example, the linear drive assembly may be arranged to move a plurality of confinement rings or a combination of components such as the confinement ring and the upper electrode.

In accordance with another embodiment of the present invention, the linear motion of the linear drive assembly is configured to move both the confinement ring and the upper electrode. In this manner, increased control of various parameters associated with processing may be obtained. For example, moving the confinement ring and upper electrode can change the pressure and plasma density inside the active area above the substrate. Therefore, either of the bodies may be moved to maintain substrate to substrate uniformity.

Figure 6:
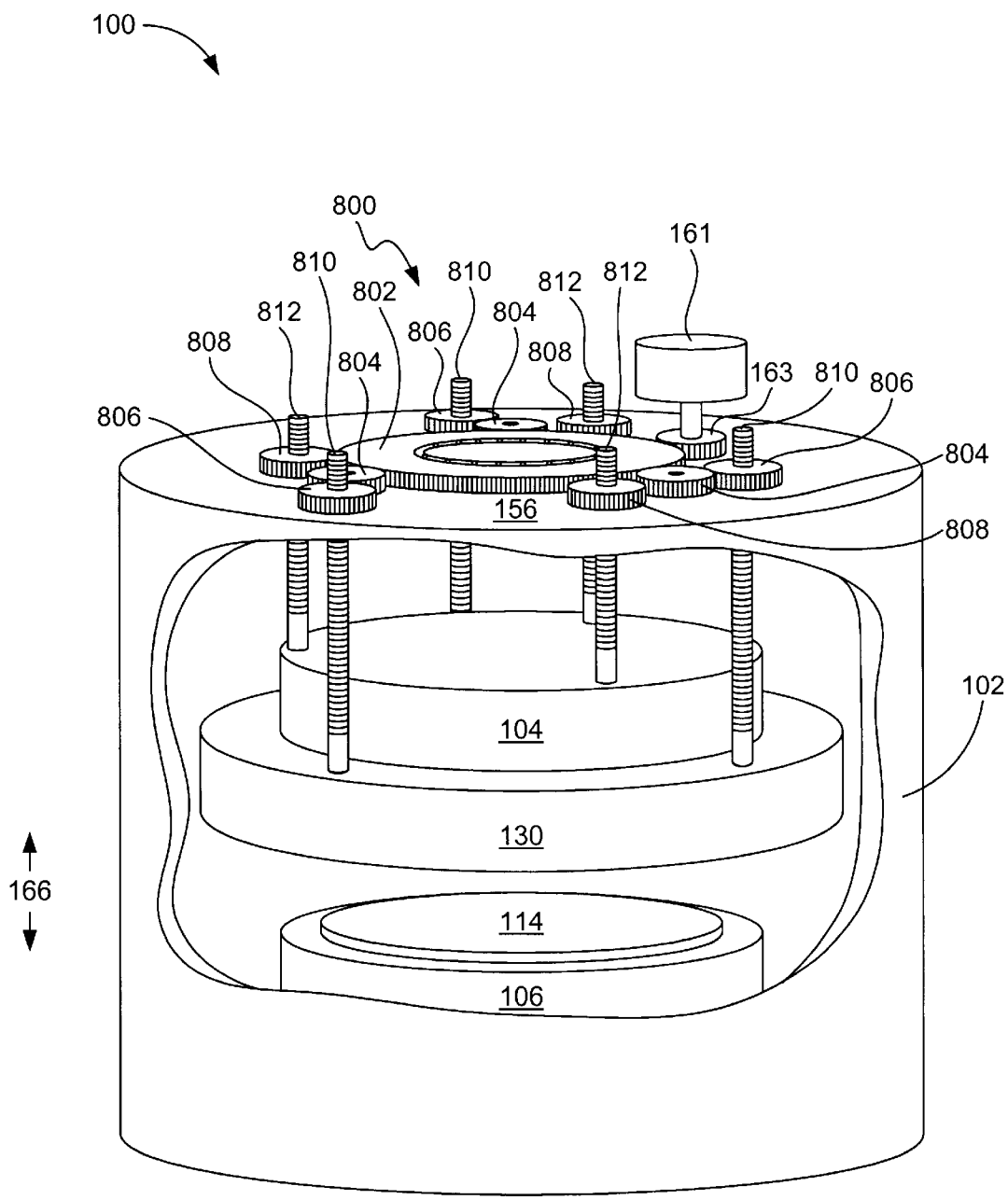
FIG. 6 is a broken away, perspective view of a plasma reactor, in accordance with one embodiment of the present invention.
Figure 7:
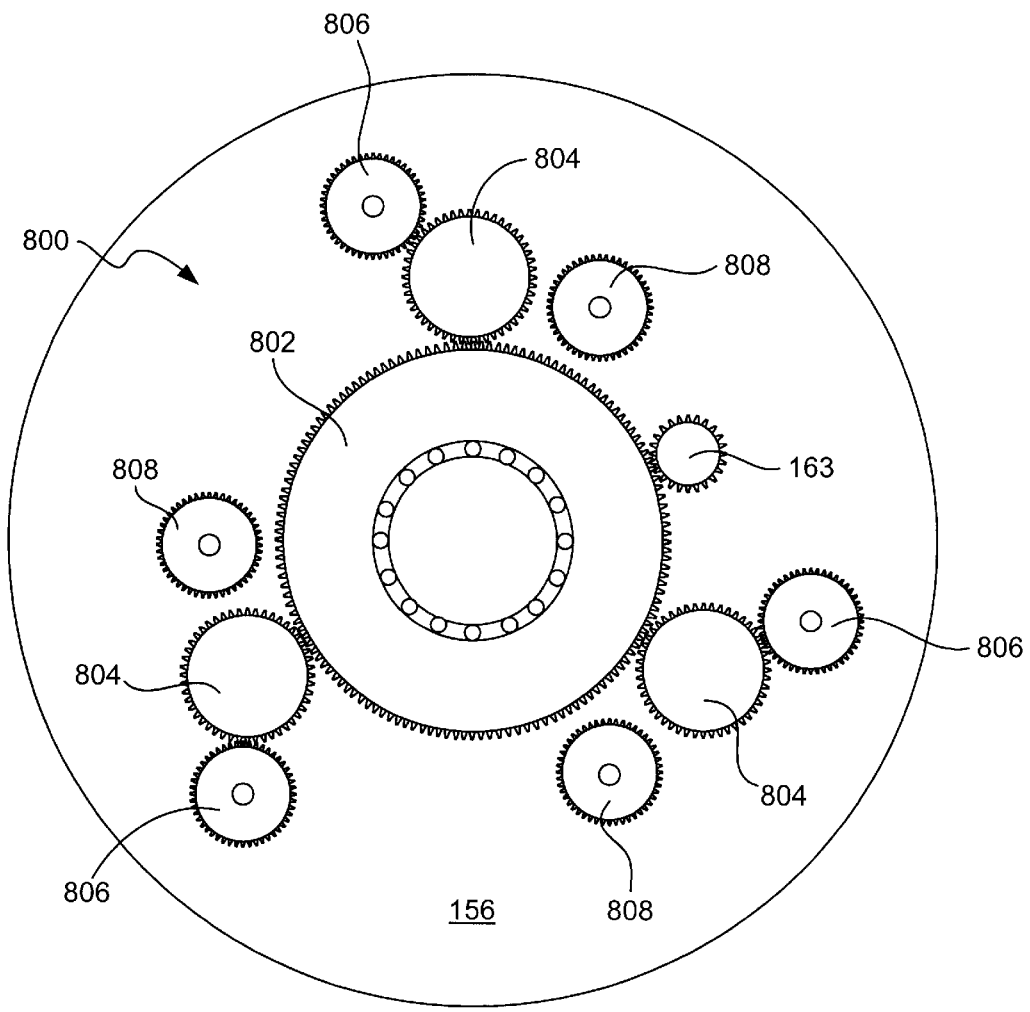
FIG. 7 is a top elevation view, in cross section, of the plasma reactor of FIG. 6.

To facilitate discussion of this aspect of the present invention, FIGS. 6 & 7 show plasma reactor 100 including a linear drive assembly 800 that is configured for moving multiple bodies inside the process chamber 102. In this figure, the linear drive assembly 800 is produced in accordance with the teachings of the invention set fourth above with regards to FIGS. 1–5. Thus, the linear drive assembly 800 is configured for moving the confinement ring 130 between the upper and lower electrode 104 and 106 and for moving the upper electrode 104 inside the process chamber 102 (both with increased movement control) to control various parameters associated with processing.

The linear drive assembly 800 generally includes a first gear 802 and a plurality of second gears 804. Both first gear 802 and the plurality of second gears 804 are rotatably supported by the cover 156 of process chamber 102. Furthermore, the plurality of second gears 804 are operatively engaged with first gear 802. Linear drive assembly 800 also includes a plurality of third gears 806 and a plurality of fourth gears 808, which are both rotatably and rigidly supported by process chamber 102. A first set of positioning members 810 are movably coupled to the third set of gears 806 and a second set of positioning members 812 are movably coupled to the fourth set of gears 808. Both sets of positioning members 810 and 812 are movably coupled in a linear direction 166. As shown, the linear direction 166 is perpendicular to the plane created by the top surface of substrate 114. Furthermore, the first set of positioning members 810 are fixed to the confinement ring 130 and the second set of positioning members 812 are fixed to the upper electrode 102.

Moreover, the second gears 804 are movably coupled to the process chamber 102 and are configured for engagement and disengagement with the third gears 806 and the fourth gears 808. More particularly, the second gears 704 have at least two positions on the cover of process chamber 102. A first position (as illustrated) causes the second gear 804 to be operatively engaged with the third gears 806 and a second position causes the second gear 804 to be operatively engaged with the fourth gears 808. In one embodiment, the second gears 804 are configured to slide between these positions in a groove disposed in cover 156. A clutch is also provided, in this embodiment, to move the second gears between positions to connect and disconnect the second gears from the third and fourth gears. In one implementation, the clutch is configured to be part of a closed loop process that automatically engages and disengages the second gears 804. Clutches are well known in the art, and therefore, for the sake of brevity will not described in detail.

Additionally, the linear drive assembly includes a motor 161 and a driving gear 163, which is fixed to motor 161. The driving gear 163 is operatively engaged with the first gear 802, and configured for driving the first gear 702 when the motor 161 is actuated. When the second gears 804 are engaged with the third gears 806, motor 161 drives driving gear 163, driving gear 163 drives first gear 802, first gear 802 drives the plurality of second gears 804, and the plurality of second gears 804 drive the plurality of third gears 806, the third gears correspondingly move the corresponding positioning members 810 in the linear direction 166, which as a result moves the confinement ring 130 in the linear direction 166 between upper electrode 104 and lower electrode 106. When the second gears 804 are engaged with the fourth gears 808, motor 161 drives driving gear 163, driving gear 163 drives first gear 802, first gear 802 drives the plurality of second gears 804, and the plurality of second gears 804 drive the plurality of fourth gears 808, the fourth gears 808 correspondingly move the corresponding positioning members 812 in the linear direction 166, which as a result moves the upper electrode 102 in the linear direction 166.

To elaborate further, the first set of positioning members 810 are threadably coupled to third gears 806 and the second set of positioning members 812 are threadably coupled to the fourth gears 808. As mentioned previously, the positioning members and the corresponding gears are fitted with screw threads which move the positioning member in the linear direction when the corresponding gears are rotated.

Further, the plurality of second gears 804 and the driving gear 163 are generally disposed about the periphery of the first gear 802. Accordingly, the movement of the second gears are synchronized with one another. That is, the direction of movement (e.g., clockwise or counter clockwise) and the magnitude of the movement (e.g., amount of teeth that are moved) are the same. Further still, the third set of gears 806 are generally disposed proximate the second gears 804 and above the confinement ring 130 and the fourth set of gears 808 are generally disposed proximate the second gears 804 and above the upper electrode 102. As shown, each of the third gear/positioning member arrangements and fourth gear/positioning member arrangements are symmetrically spaced around the first gear, and each of the positioning members are axially oriented in the center the corresponding gears.

As with the linear drive assembly described in FIGS. 1–5, the linear drive assembly described in FIGS. 6 & 7 can be configured with high resolution by adjusting the amount of teeth on the gears and the pitch of the positioning members. Furthermore, the linear drive assembly of FIGS. 6 & 7 may also be part of a control loop system as previously described.

As can be seen from the foregoing, the present invention offers numerous advantages over the prior art. Different embodiments or implementations may have one or more of the following advantages.

One advantage of the invention is that the linear drive assembly provides precise movements having high resolution, high sensitivity and increased reliability. As a result, components such as the confinement ring and the upper electrode can be moved with a greater range of control. Accordingly, parameters such as wafer area pressure and plasma density can be controlled to provide increased process uniformity (i.e., uniformity across the surface of the substrate and substrate to substrate uniformity), which increases substrate throughput, reduces device failure, and increases the overall productivity of the substrates being processed.

Another advantage of the invention is that it is cost effective. By way of example, the present invention, using only a single motor, can be configured to move multiple bodies within the process chamber. Further, the present invention reduces the amount of consumable parts (e.g., wear). As a result, the cost of acquiring and maintaining the system is reduced. Another particular advantage of the present invention is that the control is in real time, i.e., the linear movements can be made during the processing of a single substrate.

While this invention has been described in terms of several preferred embodiments, there are alterations, permutations, and equivalents which fall within the scope of this invention. By way of example, although only spur gears have been described and shown, it should be understood that other gear configurations, such as helical gears, herringbone gears, worm gears, bevel gears, sector gears, belts and/or chains may be used. Additionally, the positioning member/second gear arrangement may be configured as rack and pinion gears, which are configured to move in the linear direction. Further, although only a motor with a driving gear is shown and described, it should be noted that other drive mechanisms may be used. For example, the motor may be directly coupled to the first gear, or indirectly coupled to the first gear with belts or chains.

It should also be noted that there are many alternative ways of implementing the methods and apparatuses of the present invention. For example, although the linear drive assembly is described as being arranged to move the confinement ring and the upper electrode, it should be understood that it may also be configured to move other bodies, such as the lower electrode. Furthermore, the linear direction may be used to move bodies in directions other than perpendicular with the substrate. For example, the linear drive assembly may be used to move bodies parallel to the substrate surface.

Additionally, it is contemplated that the present invention may be used in any reactor that is suitable for etching or deposition. By way of example, the present invention may be used in any of a number of suitable and known deposition processes, including chemical vapor deposition (CVD), plasma enhanced chemical vapor deposition (PECVD), and physical vapor deposition (PVD), such as sputtering. Furthermore, the present invention may be used in any of a number of suitable and known etching processes, including those adapted for dry etching, plasma etching, reactive ion etching (RIE), magnetically enhanced reactive ion etching (MERIE), electron cyclotron resonance (ECR), or the like.

It is therefore intended that the following appended claims be interpreted as including all such alterations, permutations, and equivalents as fall within the true spirit and scope of the present invention.

What is claimed is:

1. A plasma processing system for processing a substrate, comprising:
    a confinement ring for confining a plasma inside a process chamber; and
    a gear drive assembly for moving said confinement ring in a linear direction during said processing of said substrate.

2. The plasma processing system as recited in claim 1 wherein said gear drive assembly is configured to move said confinement ring along a first axis of said process chamber, said confinement ring being disposed in a plane that is orthogonal to said first axis.

3. The plasma processing system as recited in claim 1 wherein said confinement ring confines the plasma to an area above said substrate.

4. The plasma processing system as recited in claim 1 wherein said confinement ring is moved in said linear direction to control a pressure at a surface of said substrate during said processing.

5. The system as recited in claim 4 wherein said confinement ring is moved in a first linear direction to increase the pressure at the surface of said substrate during processing, and wherein the confinement ring is moved in a second linear direction opposite the first linear direction to decrease the pressure at the surface of said substrate during processing.

6. The plasma processing system as recited in claim 1 wherein said substrate is a semiconductor wafer.

7. The plasma processing system as recited in claim 1 wherein said gear drive assembly includes a first gear, one or more second gears and one or more positioning members, said first gear being configured for driving said second gear, and said second gear being configured for moving said positioning member in said linear direction, said positioning member being fixed to said confinement ring such that when said positioning member is moved in said linear direction so is said confinement ring.

8. The plasma processing system as recited in claim 7 wherein said first gear is rotatable relative to said process chamber, wherein said second gear is movable relative to said process chamber and in movable contact with said first gear, and wherein said positioning shaft is movable relative to said second gear and in movable contact with said second gear.

9. The plasma processing system as recited in claim 8 further including a plurality of second gears and a plurality of positioning members.

10. The plasma processing system as recited in claim 9 wherein said second gears and said positioning members are symmetrically spaced apart about the periphery of said first gear.

11. The plasma processing system as recited in claim 9 wherein said plurality of positioning members move in an orchestrated manner parallel to said linear direction as said first gear is rotated and said plurality of second gears stay in movable contact with said first gear.

12. The plasma processing system as recited in claim 8 wherein a gap is provided between said confinement ring and a plane defined by said substrate when said substrate is disposed within said process chamber for processing, and wherein the size of said gap is changed during processing, by moving said confinement ring in said linear direction, to control a flow of gases therethrough.

13. The plasma processing system as recited in claim 1 wherein said substrate is held stationary in said process chamber during said processing.

14. The plasma processing system as recited in claim 1 wherein an etching task is employed in said processing to selectively remove materials from predefined areas on a surface of said substrate or a deposition task is employed in said processing to selectively deposit materials on predefined areas on a surface of said substrate.

15. A plasma processing system for processing a substrate, comprising:

an electrode for generating an electric field inside a process chamber; and a gear drive assembly for moving said electrode in a linear direction during said processing of said substrate.

16. The plasma processing system as recited in claim 15 wherein a gap is provided between said electrode and a plane defined by said substrate when said substrate is disposed within said process chamber for processing, said gap defining a process region in which a plasma is both ignited and sustained for processing, and wherein the size of said gap is changed during processing, by moving said electrode in said linear direction, to control a volume of said process region.

17. The plasma processing system as recited in claim 15 wherein said electrode is disposed above said substrate during processing, and wherein said electrode is coupled to an RF power supply that supplies said electrode with RF energy.

18. The plasma processing system as recited in claim 15 wherein said electrode is disposed below said substrate during processing, and wherein said electrode is coupled to an RF power supply that supplies said electrode with RF energy.

19. The plasma processing system as recited in claim 15 wherein said gear drive assembly includes a first gear, one or more second gears and one or more positioning members, said first gear being configured for driving said second gear, and said second gear being configured for moving said positioning member in said linear direction, said positioning member being fixed to said electrode such that when said positioning member is moved in said linear direction so is said electrode.

20. The plasma processing system as recited in claim 15 wherein the electric field helps to form a plasma capable of etching the substrate.

21. A plasma processing system for processing a substrate, comprising:

an electrode for generating an electric field inside a process chamber;

a confinement ring for confining a plasma inside said process chamber; and a gear drive assembly for moving said confinement ring and said electrode in a linear direction during said processing of said substrate.

22. The plasma processing system as recited in claim 21 wherein said gear drive assembly is arranged to independently move said confinement ring and said electrode in said linear direction.

23. The plasma processing system as recited in claim 22 wherein said gear drive assembly includes a first gear, a plurality of second gears and a plurality of positioning members, said first gear being configured for driving said plurality of second gears, said plurality of second gears being configured for moving said plurality of positioning members in a linear direction, said plurality of positioning members being fixed to said confinement ring or said electrode such that said confinement ring or said electrode is moved in said linear direction when said plurality of positioning members are moved by said plurality of second gears.

24. A plasma processing system for processing a substrate, comprising:

a process chamber within which a plasma is both ignited and sustained for said processing; and a process component capable of effecting said plasma within said process chamber; and a gear drive assembly for moving said process component in a linear direction during said processing of said substrate with said plasma.

* * * * *